(12) United States Patent
Kawaguchi et al.

(10) Patent No.: US 8,779,397 B2
(45) Date of Patent: Jul. 15, 2014

(54) SUBSTRATE COVER AND CHARGED PARTICLE BEAM WRITING METHOD USING SAME

(75) Inventors: Michihiro Kawaguchi, Shizuoka (JP); Keisuke Yamaguchi, Shizuoka (JP); Shun Kanezawa, Shizuoka (JP); Soichiro Mitsui, Kanagawa (JP); Kiminobu Akeno, Kanagawa (JP)

(73) Assignees: NuFlare Technology, Inc., Numazu-shi (JP); Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 12/970,084

(22) Filed: Dec. 16, 2010

(65) Prior Publication Data

US 2011/0155930 A1    Jun. 30, 2011

(30) Foreign Application Priority Data

Dec. 25, 2009  (JP) ................... 2009-294846

(51) Int. Cl.
*H01J 37/317* (2006.01)
*H01J 37/20* (2006.01)

(52) U.S. Cl.
CPC ..... *H01J 37/3174* (2013.01); *H01J 2237/0044* (2013.01)
USPC .................... 250/492.3; 250/491.1

(58) Field of Classification Search
CPC .............................. H01J 2237/0044
USPC .............. 250/559.36, 491.1–492.3
See application file for complete search history.

(56) References Cited

U.S. PATENT DOCUMENTS

| 5,717,204 | A  | * | 2/1998  | Meisburger et al. .......... 250/310 |
| 7,608,528 | B2 | * | 10/2009 | Tachikawa .................... 438/487 |
| 2007/0228525 | A1 | * | 10/2007 | Yamanaka et al. ............ 257/621 |
| 2008/0054195 | A1 |   | 3/2008  | Tachikawa |
| 2008/0203334 | A1 |   | 8/2008  | Mitsui et al. |
| 2009/0029031 | A1 | * | 1/2009  | Lowrey ........................... 427/58 |
| 2009/0079322 | A1 |   | 3/2009  | Tsutsumi et al. |
| 2009/0279816 | A1 | * | 11/2009 | Gomyo et al. ................ 384/100 |
| 2010/0246144 | A1 | * | 9/2010  | Yamazaki et al. ............ 361/749 |
| 2011/0084220 | A1 | * | 4/2011  | Koning et al. ............. 250/492.3 |

FOREIGN PATENT DOCUMENTS

| JP | 2008-58809 | 3/2008 |
| JP | 2008-210951 | 9/2008 |
| JP | 2009-76361 | 4/2009 |

* cited by examiner

*Primary Examiner* — Michael Logie
*Assistant Examiner* — Eliza Osenbaugh-Stewar
(74) *Attorney, Agent, or Firm* — Oblon, Spivak, McClelland, Maier & Neustadt, L.L.P.

(57) ABSTRACT

A substrate cover 40 includes a conductive portion 41 having a shape corresponding to a peripheral edge region of a substrate. Since at least part of the conductive portion includes transmissive portions 47 each formed of a light transmissive member, it is configured so as to allow desired light to penetrate through. The position of each edge portion of the substrate is detected in such a manner that the substrate is disposed with the substrate cover 40 placed thereon between light irradiation means and a light detecting unit, irradiation light directed from the light irradiation means located above the substrate to the edge portion of the substrate is made to penetrate through at least part of the substrate cover 40, the edge portion of the substrate is then irradiated with light from the irradiation means.

6 Claims, 11 Drawing Sheets

SUBSTRATE COVER AND CHARGED PARTICLE BEAM WRITING METHOD USING SAME

CROSS-REFERENCE TO THE RELATED APPLICATION

The entire disclosure of the Japanese Patent Application No. 2009-294846, filed on Dec. 25, 2009 including specification, claims, drawings and summary, on which the Convention priority of the present application is based, are incorporated herein in its entirety.

FIELD OF THE INVENTION

The present invention relates to a substrate cover. The invention more specifically relates to a substrate cover disposed on a substrate in its use, wherein the substrate will be subjected to pattern writing later using a charged particle beam, and a charged particle beam writing method using the same.

BACKGROUND ART

With high integration of a semiconductor integrated circuit, a trend for patterns for LSI (Large Scale Integration) has recently become finer and more complex. The wavelength of deep ultraviolet light used in pattern's transfer is 193 nm whereas the size of a pattern to be transferred is shorter than the wavelength. With a demand for such miniaturization, a lithography technology has also become more advanced and complicated. To produce LSI in large quantity, the degree of freedom needed to design changes of mask patterns different for each product is also necessary for a lithography technology capable of transferring each pattern written on a mask which is an original picture onto a wafer. An electron beam lithography technology has therefore been used in pattern writing to the mask.

The electron beam lithography technology has an excellent resolution because an electron beam to be used is a charged particle beam. The electron beam lithography technology also has the advantage that it can suppress size fluctuations because the focal depth can be adjusted accurately. Therefore, the electron beam lithography technology has been in widespread use even in manufacturing of a mask or a reticle used when transferring an LSI pattern to a wafer. Further, an electron beam writing apparatus which directly writes patterns on a wafer using the electron beam lithography technology has been applied to the development of leading-edge devices, one typical example being a DRAM, another example, being used in part of the production of an ASIC.

The electron beam writing apparatus for realizing such an electron beam lithography technology is normally provided with a writing chamber which includes a stage for placing thereon a substrate (mask or wafer) target for writing, and an electronic lens barrel which applies an electron beam from an electron gun to the substrate placed on the stage.

Since the range in which the electron beam can be deflected and controlled is limited in the electron beam writing apparatus, each pattern is formed on the entire substrate by writing done while the substrate placed on the stage is being moved.

When writing is performed on the mask, a conductive material formed on the mask, e.g., a resist formed on a light shielding layer using chromium (Cr) becomes charged. If the writing continues in this state, then the trajectory of the electron beam is deflected due to an electric field created by the charged mask, thus resulting in an inability to perform writing to a desired position. It is therefore practice to ground a charged layer.

A substrate cover has been described in Japanese Patent Laid-open No. 2008-058809, which includes a frame which is formed larger in outer dimension than the outer peripheral end of a substrate in which a pattern will be written using an electron beam and formed with an opening at its central part in a size smaller than the outer peripheral end thereof, and earth pins which are provided on the lower side of the frame and make connections to the substrate. A configuration in which the substrate cover is disposed on its corresponding substrate to be subjected to writing has been described in Japanese Patent Laid-open No. 2008-058809. The substrate cover is formed entirely of a conductive metal material. Alternatively, one in which the surface of an insulating material such as a ceramic material or the like is coated with a conductive material is preferred as the substrate cover. Thus, according to the above configuration, the peripheral edge portion of the substrate is prevented from becoming charged, because electrons scattered in the neighborhood of the peripheral edge portion of the substrate are captured by the substrate cover.

The placement of such a substrate cover on the substrate such as the mask or the like is enabled by placing the substrate cover on the substrate outside the writing chamber before the substrate is carried in the writing chamber in which writing is done. In this case, it is preferable that a storage chamber for accommodating the substrate cover therein is provided outside the writing chamber, and the substrate cover can be attached onto the substrate in the storage chamber or detached therefrom. Incidentally, it is also possible to fix the substrate cover onto its corresponding stage in the writing chamber and place the substrate cover on the substrate in the writing chamber after the substrate has been carried in the writing chamber.

Thus, electron beam writing is performed on the substrate with the substrate cover placed thereon, on the stage in the writing chamber. In this case, in order to apply an electron beam to the substrate in the writing chamber and thereby perform writing with desired accuracy, the substrate is preferably positioned in the storage chamber. It is further necessary to position the substrate target for writing in the writing chamber before the irradiation of the electron beam.

FIG. 11 is a schematic diagram showing a configuration of a position detecting device applicable to a conventional electron beam writing apparatus.

In the conventional electron beam writing apparatus, such a position detecting device 210 having the configuration as shown in FIG. 11 can be used for positioning a substrate such as an object for writing. The position detecting device 210 includes an illumination device 211, a camera 213, an illumination controller 215, a camera controller 216, and a control device 220.

The position detecting device 210 is disposed in a writing chamber, detects a position of the substrate, and then locates the substrate. However, a method for positioning a substrate 200 with no above substrate cover placed thereon will be explained.

The illumination device 211 is disposed above or below the substrate 200 target for positioning and is capable of applying light in the direction perpendicular to the surface (upper surface) or back surface (lower surface) of the substrate 200. Then, the substrate 200 is disposed between the illumination device 211 and camera 213 of the position detecting device 210. Next, illumination light is applied to edge portion of the surface of the substrate 200 from above the substrate 200.

Specifically, the illumination controller 215 is given a lighting instruction from the control device 220 which illuminates device 211.

The camera 213 takes an image near the edge portion of the substrate 200 in a state in which the illumination light has been applied from the illumination device 211. Specifically, the camera controller 216 given an imaging instruction from the control device 220 performs imaging through the camera 213. Then, the edge position of the substrate 200 is detected to locate the substrate.

Although the configuration of the position detecting device 210 applicable to the conventional electron beam writing apparatus, and the method for the positioning the substrate 200 using the same are as described above, a problem arises where an attempt is made to apply this to the substrate on which the substrate cover is placed.

Namely, when the substrate cover (not shown) is placed on the substrate 200 target for writing, this becomes a light shielding canopy, thereby interfering with the application of the illumination light from the illumination device 211 to the edge portion of the substrate 200 located below the substrate cover.

As a result, the camera 213 opposite to the illumination device 211 with the substrate 200 interposed in between is not capable of imaging the edge portion of the substrate 200, thus making it unable to position the substrate edge and, as a result, the substrate 200.

A position detecting device has been described in Japanese Patent Laid-open No. 2008-210951 which includes another illumination device for irradiating a substrate with light in a direction parallel to the front and back surfaces of the substrate as viewed from a lateral direction in addition to an illumination device lying above the substrate. The position detecting device enables the detection of a substrate's edge position.

In the position detecting device described in Japanese Patent Laid-open No. 2008-210951, even if the substrate cover described above is placed on the substrate, the application of light to the substrate's edge portion is enabled by the irradiation of the illumination light from the lateral direction, so that the positioning of the substrate is made possible.

When, however, an attempt is made to apply the illumination light to the substrate only by the irradiation of the illumination light from the lateral direction, an image to be taken by a camera may be affected by the shape of the side portion of the substrate and the degree of chamfering of the substrate. Namely, when a film such as a resist formed on the substrate is rounded on the side face of the substrate, light dependent on the shape of a film portion at the side portion thereof and reflected by that portion may enter the camera located below the substrate, so that this may affect the imaging of the substrate edge.

According to the degree of chamfering at the side surface of the substrate, light reflected thereby may enter the camera lying below the substrate, so that this may affect the imaging of the substrate edge. In such a case, it is not possible to perform the accurate imaging of the edge portion, by extension, the accurate positioning of the substrate as compared with the case in which the illumination light is applied from above.

When an attempt is made to apply such a position detecting device described in Japanese Patent Laid-open No. 2008-210951 to the storage chamber of the substrate described above, it is necessary to position the substrate before and after the placement of the substrate cover onto the substrate. However, the substrate edge is imaged by illumination from above the substrate before the placement of the substrate cover thereon, whereas after the placement of the substrate cover thereon, the substrate edge is imaged by illumination from the direction of the side surface of the substrate. It is thus not possible to perform, within the storage chamber, the positioning of the substrate by the same method before and after the placement of the substrate cover. In such a case, the operation of positioning the substrate becomes complicated, and there is a need to detect the substrate edge by properly using two methods different in accuracy, thus resulting in an inability to perform the accurate positioning of the substrate.

Likewise, it is not possible to accurately determine the positioning between the substrate cover and the substrate on which the substrate cover is placed. Namely, even if the substrate cover is shifted while being placed on the substrate, it is not possible to accurately detect its shift.

When the position of the placement of the substrate cover is displaced, the position of the substrate cover on the substrate changes from a predetermined position, and thereby the position of writing on the substrate may be degraded. In order to prevent degradation of such a writing position, there is a need to control the position between the substrate and the substrate cover in the order of about a few µm to about a few tens of µm, for example.

When the position of the placement of the substrate cover with respect to the substrate is displaced from a predetermined position, there is a case in which the potential of the surface of the substrate at the time of electron beam writing changes and the influence on the accuracy of writing to the substrate cannot be ignored.

The accuracy of writing to the substrate needs an nm order. It is necessary to reduce a relative position displacement between the substrate and the substrate cover, corresponding to one factor that causes an error, and control the positioning between the substrate and the substrate cover.

Incidentally, when an attempt is made to place the substrate cover on the substrate within the writing chamber as described above, it is not possible to perform the positioning of the substrate with desired accuracy and control the positioning between the substrate and the substrate cover with desired accuracy.

Accordingly, there has been a demand for the development of a substrate cover, particularly a substrate cover disposed on a substrate in its use, wherein the substrate will be subjected to pattern writing later using an electron beam such as a charged particle beam, the substrate cover enabling more accurate positioning of the substrate and thereby enabling the positioning of the substrate by irradiation of light from above the substrate.

The present invention has been made in view of such problems. Namely, an object of the present invention is to provide a substrate cover which enables the application of light to the edge portion of a substrate by light irradiation means provided above the substrate and consequently enables the detection of a position of the edge portion of the substrate by a light detecting device provided below the substrate. The object of the present invention is to provide a charged particle beam writing method which enables the positioning of a substrate target for writing with desired accuracy using this novel substrate cover, enables the control of the positioning between the substrate and the substrate cover with desired accuracy, and enables the realization of a desired pattern size and pattern accuracy. Other advantages and challenges of the present invention are apparent from the following description.

SUMMARY OF THE INVENTION

The present invention relates to a substrate cover and charged particle beam writing method. In the first embodiment, a charged particle beam writing apparatus comprising: a substrate cover positioned on a substrate wherein a charged particle beam will write a pattern on the substrate; the substrate cover comprising; a conductive portion having a shape corresponding to the peripheral edge region of the substrate, wherein at least part of the conductive portion is formed of a light transmissive member and a portion other than the light transmissive member is filled with a member designed for filling in a gap; further comprising a conductive material or a film of a conductive material provided on the surface of an insulative material.

In another embodiment of this invention a charged particle beam writing method comprising: aligning a substrate target for writing using a charged particle beam; placing a substrate cover on the substrate;
detecting a position of an edge portion of the substrate using position detecting means that includes light irradiation means and a light detecting unit; and irradiating the substrate with the charged particle beam, wherein the substrate cover includes a conductive portion having a shape corresponding to a peripheral edge region of the substrate, wherein at least part of the conductive portion is configured so as to cause light emitted from the light irradiation means to penetrate through, and the edge portion of the substrate is then irradiated with light from the irradiation means.

DETAILED DESCRIPTION OF THE EMBODIMENTS

An embodiment of the present invention will be described in detail below.

Figure 1:
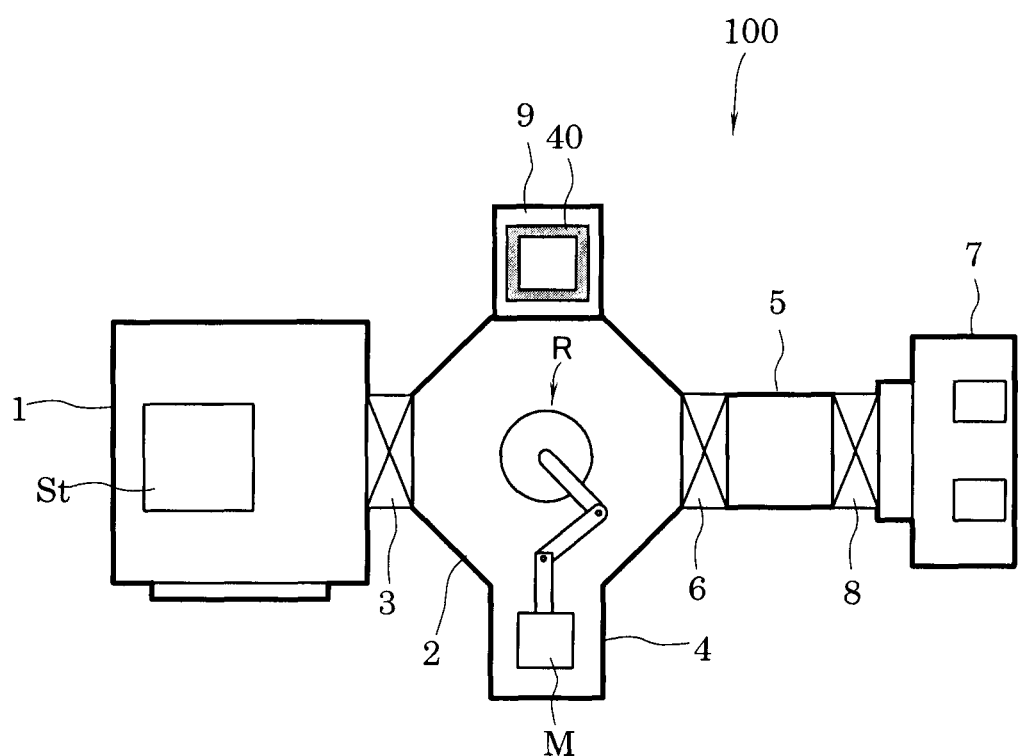
FIG. 1 is a schematic diagram showing a configuration of an electron beam writing apparatus according to the present embodiment.

FIG. 1 is a schematic diagram showing a configuration of an electron beam writing apparatus according to the present embodiment, which is illustrative of one example of a charged particle beam writing apparatus. The electron beam writing apparatus 100 applies an electron beam (being one example of a charged particle beam) to a mask M (being one example of a substrate target for writing), thereby writing a predetermined pattern. The electron beam writing apparatus 100 includes a writing chamber 1 for writing each pattern onto the mask M, a robot chamber 2 which is disposed in a position adjacent to the writing chamber 1 and incorporates a transfer robot R therein, a load lock chamber 5 disposed in a position adjacent to the robot chamber 2 on the side opposite to the writing chamber 1, and a mask loading device 7 disposed in a position adjacent to the load lock chamber 5 on the side opposite to the robot chamber 2.

Gate valves 3, 6 and 8 are provided between the robot chamber 2 and the writing chamber 1, between the robot chamber 2 and the load lock chamber 5, and between the load lock chamber 5 and the mask loading device 7, respectively. Further, an alignment chamber 4 for positioning the mask M, and a storage chamber 9 for accommodating a substrate cover 40 according to the present embodiment in a position opposite to the alignment chamber 4 are disposed at an periphery at which they are not adjacent to the writing chamber 1 of the robot chamber 2 and the load lock chamber 5. Mounting or dismounting of the substrate cover 40 onto and from the mask M is performed within the storage chamber 9.

The mask M is loaded in the mask loading device area 7 to the load lock chamber 5 by the transfer robot R. Then, the gate valve 8 is closed to bring the load lock chamber 5 into vacuum. Thereafter, the gate valve 6 is opened to transfer the mask M from the load lock chamber 5 to the alignment chamber 4 by the transfer robot R.

Alignment (positioning) is done within the alignment chamber 4 and then the mask M is conveyed or transferred from the alignment chamber 4 to the storage chamber 9 by the transfer robot R. An edge position of the mask M is detected within the storage chamber 9 to confirm that the mask M and the substrate cover 40 are placed in a predetermined position. Thereafter, the substrate cover 40 accommodated in the storage chamber 9 is placed on the mask M.

The substrate cover 40 is placed on the mask M, and the positioning between the mask M and the substrate cover 40 is also controlled. Thereafter, the gate valve 3 is opened to convey the mask M onto a stage St of the writing chamber 1 by the transfer robot R.

If necessary, the position between the mask M and the substrate cover 40 is also adjusted again within the writing chamber 1. An electron beam is applied to the mask M placed on the stage St by a method to be described later, so that a predetermined pattern is written onto the mask M. At this time, the mask M on which the substrate cover 40 is placed is brought into alignment within the storage chamber 9, and the edge position of the mask M is thereafter confirmed within the writing chamber 1 as will be described later. After its confirmation, a predetermined pattern can also be written onto the mask M.

Incidentally, after the mask M is brought into alignment within the alignment chamber 4, the substrate cover 40 is placed on the mask M in the storage chamber 9 and the edge position of the mask M is detected. Thereafter, the mask M with the substrate cover 40 placed thereon is carried into the writing chamber 1. Alignment subsequent to the placement of the substrate cover 40 on the mask M can also be performed within the writing chamber 1. The detection and confirmation of the edge position of the mask M, which are to be described later, are carried out within the storage chamber 9 and the writing chamber 1. It is further also possible to write a predetermined pattern onto the mask M within the writing chamber 1 after alignment has also been done at the individual chambers.

Furthermore, after the alignment of the mask M has been done in the alignment chamber 4, it is also possible to place the substrate cover 40 on the mask M within the writing chamber 1 without placing the substrate cover 40 on the mask M within the storage chamber 9 as will be described later. In this case, the detection of the edge position of the mask M to be described later is done within the writing chamber 1, and the predetermined pattern is written onto the mask M. Alternatively, it is also possible to perform alignment after the edge position of the mask M has been detected, and perform writing onto the mask M.

While the edge position of the mask M is detected upon execution of the alignment in the alignment chamber 4 in the above case, a description will be made below of the detection of the edge position of the mask M.

Figure 2:
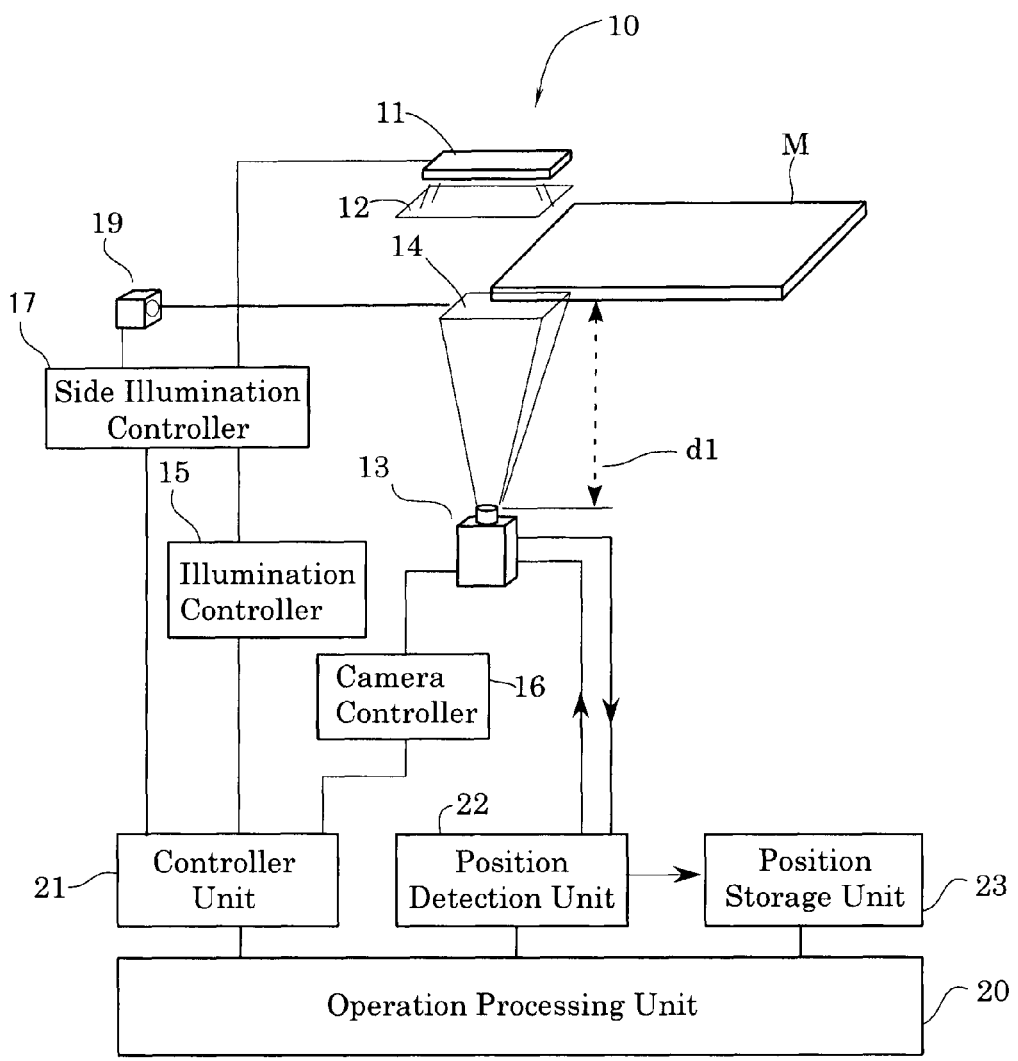
FIG. 2 is a schematic diagram showing a configuration of a position detecting device applied to the electron beam writing apparatus.

FIG. 2 is a schematic diagram showing a configuration of a position detecting device applied to the electron beam writing apparatus. As shown in FIG. 2, the position detecting device 10 includes an illumination device 11 used as light irradiation or illumination means, and a side illumination device 19. The position detecting device 10 includes a color CCD camera 13 used as a light receiving or detecting unit. Further, the position detecting device 10 includes an illumination controller 15, a camera controller 16, a side illumination controller 17, and a operation processing unit (arithmetic processing unit) 20.

The illumination device 11 is disposed above or below the mask M and applies light in the direction orthogonal to the surface (upper surface) or back surface (lower surface) of the mask M. Then, the side illumination device 19 is placed on the lateral side of the mask M and disposed in a position where a light-emitting central part thereof becomes approximately the same height as the back surface of the mask M. The side illumination device 19 can apply light to the mask M in the direction parallel to the front and back surfaces of the mask M as viewed from the lateral direction. As the illumination device 11 and side illumination device 19 for the mask M, for example, an LED which emits light in a visible light region can be used. More specifically, a blue LED or the like which emits blue light can be used. The illumination device 11 has an illumination range 12 which illuminates an edge portion (one side Ma) of the mask M sufficiently.

Incidentally, the side illumination device 19 may also be provided in plural form. By doing so, light can be applied to the mask M from the different lateral directions of the mask M and a more accurate substrate edge-position detection can be obtained.

The CCD camera 13 is positioned below the mask M and takes an image of the mask irradiated by the light in a visible region, such as blue light illuminated from the illumination device 11 and the side illumination device 19. The CCD camera 13 has a plurality of light detecting or receiving devices. Here, the distance (imaging distance) d1 from the CCD camera 13 to the back surface of the mask M is determined from the relationship between a focal distance determined from a combination of the CCD camera 13 and a lens, a required imaging area (visual field size) 14 and detection resolution per elemental device of the CCD camera 13.

In the position detecting device 10 of the present embodiment, as the illumination device 11 and the side illumination device 19 for the mask M, the LED that emits the light in the visible region can be used as described above, e.g., the blue LED that emits the blue light can be used, but they are not limited to those LEDs. LEDs can be used which emit light of other colors such as white, purple, green, yellow, orange, and red. Other lamps such as a fluorescent lamp, a halogen lamp, etc. can also be used. An LED emits light in the ultraviolet region, however, other lamps such as a fluorescent lamp, a halogen lamp, etc. can also be used. In this case, the wavelength of light to be radiated is preferably placed in a wavelength region in which a photosensitive polymeric material and a photosensitive resist lying on the mask are not exposed to light. The wavelength thereof is preferably, for example, 400 nm or more.

In that case, a CCD camera can be used as a light detecting unit. Further, a laser light radiating device can also be used instead of the illumination device 11. In that case, it is possible for the light detecting unit to detect the edge position of the mask M, based on the threshold value of a received quantity of laser light.

The illumination controller 15 controls the illumination device 11. Described concretely, the illumination controller 15 gives instructions for turning on and off the illumination device 11, instructions for changing or adjusting the quantity of illumination light of the illumination device 11 or the like in accordance with imaging timing of the CCD camera 13 based on a command issued from the operation processing unit 20. Likewise, the side illumination controller 17 controls the side illumination device 19.

The camera controller 16 controls the CCD camera 13. Specifically, the camera controller 16 gives instructions or the like for imaging time (shutter time) and imaging based on a command issued from the operation processing unit 20. When the CCD camera 13 is equipped with an autofocus mechanism, the camera controller 16 can perform a focus adjustment.

The operation processing unit 20 includes a controller control unit 21, a position detection unit 22, and a position storage unit 23.

The controller control unit 21 controls the illumination controller 15, the side illumination controller 17, and the camera controller 16. The position detection unit 22 detects each edge position of the mask M from the image picked up by the CCD camera 13 in accordance with a position detecting method to be described later. The position storage unit 23 is a storage medium (such as a memory, a magnetic disk or the like) which stores the edge position detected by the position detection unit 22.

As described above, the position detecting device 10 included in the electron beam writing apparatus 100 of the present embodiment includes the illumination device 11 which applies light onto the mask M from above, and the side illumination device 19 which applies light onto the mask M from the side. Accordingly, the detection of the edge position of the mask M only by the illumination from above the mask M can be carried out. The detection of the edge position of the mask M only by the illumination from the lateral side of the mask M can also be carried out. Further, the combination of these two methods can be carried out. They are suitably selected according to the shape of the mask M and the state of its side surface, thereby making it possible to detect the edge position of the mask M.

At this time, the accuracy of detection of the edge position of the mask M becomes low in the case of the detection only by the illumination from the lateral side of the mask M as described above. It is therefore desirable to apply illumination light from above the mask M and detect the edge position of the mask M.

In the electron beam writing apparatus 100 of the present embodiment, the position detecting device 10 described above is provided in the storage chamber 9 and the writing chamber 1, and the detection of the edge position of the mask M and the alignment of the mask M is enabled even in those chambers.

At this time, the alignment in the storage chamber 9 causes no problem if it is done before the placement of the substrate cover. Since, however, light is shielded by the substrate cover where the conventional substrate cover is placed on the mask M, this interferes with the irradiation of the edge portions of the mask M placed below the substrate cover with light emitted from the illumination device 11. Accordingly, light is applied onto the mask M from the lateral side using the side illumination device 19, and the edge portion of the mask M is imaged by the CCD camera 13. It is however not possible to perform the high-accuracy detection of the edge position of the mask M, therefore, it is not possible to obtain the high-accuracy alignment of the mask M.

Likewise, when the conventional substrate cover is used even within the writing chamber 1, light is shielded by the substrate cover. Therefore, light is applied onto the mask M from the lateral side using the side illumination device 19, thus resulting in an inability to detect the edge position with high accuracy, therefore, it is not possible to obtain the high-accuracy alignment of the mask M.

When, however, light from the illumination device 11 is applied to the edge portion of the mask M in a state in which the substrate cover of the present embodiment is placed on the mask M, the substrate cover does not substantially block the light. Thus, there is nothing to prevent the edge portion of the mask M from being imaged by the CCD camera 13. The substrate cover of the present embodiment will be explained below.

Figure 3:
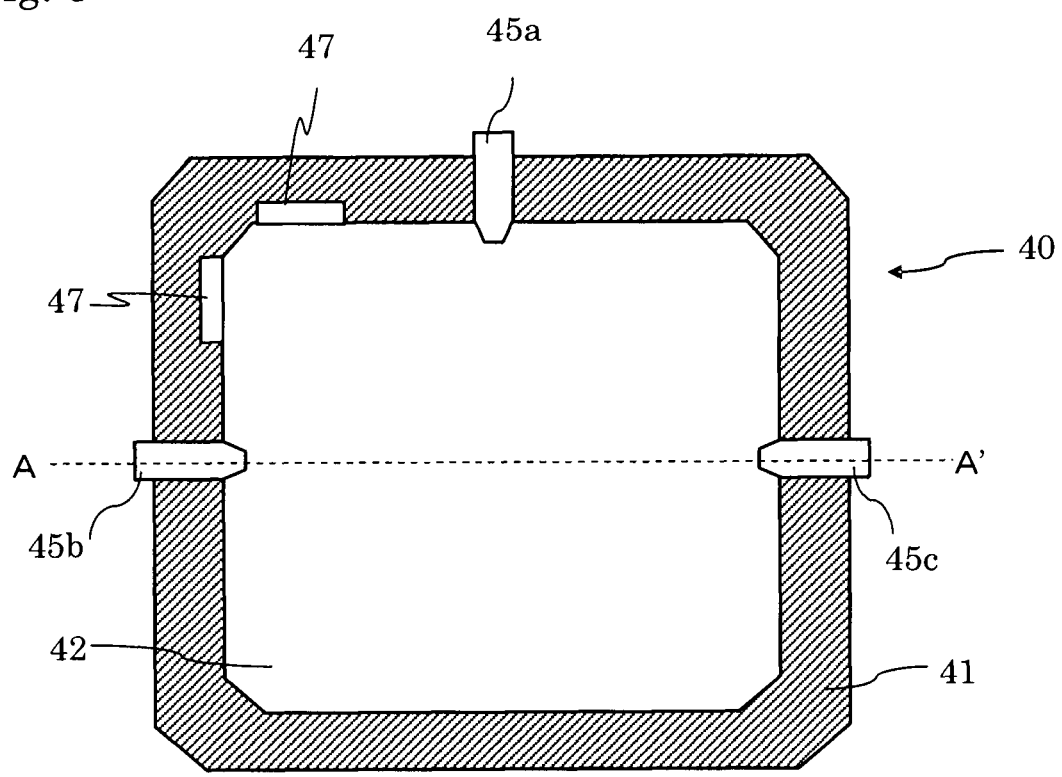
FIG. 3 is a top view of the substrate cover.
Figure 4A:
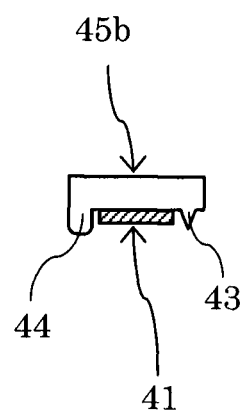
FIG. 4A and FIG. 4B are partly cross-sectional views each showing the periphery of an electrode portion taken along line A-A' of FIG. 3.
Figure 4B:
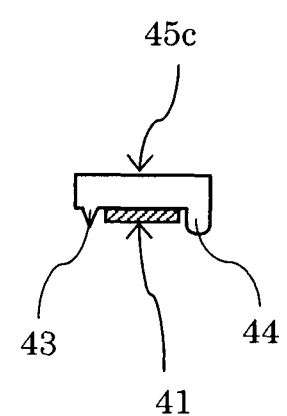

FIG. 3 is a top view of the substrate cover. FIGS. 4A and 4B are partly cross-sectional views each showing the periphery of an electrode portion taken along line A-A' of FIG. 3.

As shown in FIGS. 3 and 4, the substrate cover 40 has a conductive portion 41 provided with conductivity, having a shape corresponding to the peripheral edge region of the mask M. Here, the Mask M can consist of, for example, a quartz substrate with a chromium (Cr) light shielding layer. There can be one example in which a chromium layer is not formed at a substrate end surface (and partial edge portion). The conductive portion 41 is shaped in the form of a frame having an opening 42 at its center so as to correspond to the peripheral edge portion of the mask M.

Namely, the substrate cover 40 is formed larger in outer dimension than the outer peripheral end of the mask M and has the opening 42 formed at its central part in a size smaller than its outer peripheral end.

The conductive portion 41 of the substrate cover 40 is configured so as to have conductivity over its entire surface. The conductive portion 41 is configured using a non-magnetic and heat-resistant material which is capable of shielding an electron beam. The conductive portion 41 is formed of, for example, a conductive metal material or a member in which the surface of an insulative material such as a ceramic material or the like is coated with a conductive material.

The conductive portion 41 has transmissive portions 47 at its part each formed of a member different in property from its other portions. The substrate cover 40 of the present embodiment is provided with rectangular parallelepiped cut-away portions, which are part of the frame-shaped conductive portion 41 and are continuously connected to the opening 42 at an inner wall portion that surrounds the opening 42. Members each selected so as to allow light having a desired wavelength to pass through are fitted in the cut-away portions and configure the transmissive portions 47 of the conductive portion 41.

As to each of the transmissive portions 47 of the conductive portion 41, at least the surface thereof has conductivity in a manner similar to the other portions of the conductive portion 41, but a component or constituent member is selected such that the performance of transmission to light differs from its other portions. Namely, as for the transmissive portions 47, the members that configure the transmissive portions are selected paying attention to light transmissive performance (translucency). As a result, light having a desired property penetrates through the transmissive portions 47.

It is necessary to clarify the light that penetrates through the transmissive portions 47. It is also important to evaluate the light from the illumination device 11, especially the character of transmission to the transmissive portions 47. For example, the position detecting device 10 of the present embodiment is capable of using an LED which emits light from the illumination device 11. When a blue LED is used, the transmissive property of the blue light becomes important. The wavelength of the blue light emitted from the illumination device 11 should match the absorption wavelength of transmissive portions 47 to enable application of the light onto the mask M. This light, having penetrated through the transmissive portions 47 will reach the lower CCD camera 13 to enable imaging of the edge portion of the mask M.

When the light emitted from the illumination device 11 is visible light in different wavelength regions having colors different from the blue, such as the white light, green light, red light, etc. as described above, the transmissive portions 47 are suitable for this visible light, and the light having penetrated through the transmissive portions 47 may reach the light detecting unit lying below the mask M, e.g., the CCD camera to enable imaging of the edge portion of the mask M.

As described above, the member suitable for the configuration of each transmissive portion 47 may have characteristics which combine translucency and conductivity. It is possible to apply, for example, a member formed by coating the surface of a glass material such as synthetic quartz glass, sapphire glass or the like with a transparent conductive film such as ITO (Indium Tin Oxide), and a member coated with a thin film of another metal, such as a Cr (Chromium) film or the like. A glass material, ionic conductive glass or the like doped or implanted with ions to apply conductivity thereto due to the introduction of carriers may be used as ones having suitable translucency.

Fused silica glass, ultra-low expansion glass, heat-resistant glass, and composite glass may be used as the glass material in addition to the synthetic quartz glass and the sapphire glass if they have suitable translucency and can be used optically. Their applications are enabled by coating them with a transparent conductive film. Since the sapphire glass is strong in mechanical strength in particular, a member formed by providing an ITO film on its surface is preferred in the present embodiment.

Incidentally, the ITO film has a visible-light transmittance of 85% or so and a surface resistance of about 100 to 1000Ω/☐ and has generally been used as a practical industrial transparent electrode material. The development of a transparent electrode material free of use of a rare metal like indium has recently been performed actively as an alternative to the ITO film. Various transparent electrode materials have been put into practical use. The development of a light-transmissive metal film having a nano porous structure having translucency has also been performed. If both thereof are appropriate in translucency, they can be utilized as coating materials for the above glass materials, each of which serves as a transparent conductive film.

The member composition of each of the transmissive portions 47 will now be explained in further detail.

As described above, transparency and conductivity are applied to an amorphous or crystalline material having translucency, like the synthetic quartz glass or the sapphire glass to thereby make it possible to fabricate the transmissive portions 47 suitable for the present embodiment. Methods for applying the transparency and the conductivity are broadly divided into two types. A method for coating a transparent conductive film such as ITO or a material which combines transparency and conductivity, and a method for doping or ion-implanting a glass material itself with metal ions and applying conductivity due to the introduction of carriers are applicable.

The coating materials usable in the coating methods include an antimony-doped tin oxide film in which an SnO2 (tin oxide) film is doped with Sb (antimony), a fluorine-doped tin oxide film doped with F (fluorine), Cd—Sn—O, Ga—Zn—O, In—Ga—Zn—O based conductive films, an In2O3 (indium oxide)-SnO2 based composite oxide laminated thin film, etc. An oxide-based transparent conductive film used for electrode materials for various displays and touch panels and solar batteries can be applied as the coating material. Further, there can also be used a titanium oxide-based transparent conductive film in which titanium oxide is doped with Nb.

It is needless to say that even in addition to such an oxide-based transparent conductive film, a metal ultrathin film (about a few nm to about a few tens of nm) and a metal alloy thin film of low resistance are used as the coating materials to thereby enable the acquisition of translucency. Regarding the metal ultrathin film, there can be used, for example, aluminum, gold, silver, palladium or the like, in addition to Cr. The metal ultrathin film has, however, a tendency to become low in visible-light transmittance in general as compared with the oxide-based transparent conductive film and has an aspect depending on a film forming method in terms of an improvement in the visible-light transmittance.

It is however known that the position detecting device 10, included in the electron beam writing apparatus 100 according to the present embodiment shown in FIG. 2, has a transmittance of about 80% when, for example, a 20 nm thin film of Cr is used, and the film can sufficiently be used as the coating material. Thus, the metal material is suitably selected and its thickness and composition are adjusted in such a manner that the transmittance at a detected wavelength is realized to such an extent that a predetermined detection accuracy is obtained at the position detecting device.

It is known that the metal ultrathin film assumes an island structure and becomes high in resistance. Although this also depends on the film forming method, for example, the surface resistance of 20-nm thick Cr becomes 1 M$\Omega$/□ or so. Antistatic applications necessary for the transmissive portions 47 do not necessarily need to be good conductors. If the surface resistance generally ranges from about $1 \times 10^5$ to $1 \times 10^{13} \Omega$/□, it is possible to allow the electric charge to escape to the earth in a short period of time. It is therefore possible to use the film as a coating material having an antistatic function. It may of course be low in resistance.

The light-transmissive metal film tried to obtain the visible-light transmittance by the nano porous structure may also be used as a transparent conductive film formed by coating a glass material. An example of such a light-transmissive metal film has been described in Japanese Patent Laid-open No. 2009-76361. If the nano porous structure is adopted, the amount of an electric charge on a glass material of an insulator exposed to a porous portion is extremely low and the electric charge is allowed to escape to the earth through a mesh-like metal conductor.

Thus, if the various coating materials described above have predetermined transparency and conductivity, their film forming method or composition are not limited in particular, and they can be applied to the member for the transmissive portions 47.

As a film forming method for a transparent conductive film and a method for coating a material which combines translucency and conductivity, there can be used known techniques such as vacuum deposition, a magnetron sputtering method, an atmospheric-pressure CVD method, a plasma CVD method, a MOCVD method and the like. Even in addition to those, it is possible to apply general methods such as a sol-gel method, an ion plating method, an application method, a spray coating method and the like. It is however needless to say that it is necessary to ensure adhesion, durability and the like related to film's peeling and particulate emission in particular, and it is necessary to select a condition having taken that point into sufficient consideration. As to the details of the formation of the transparent conductive film, it is possible to apply techniques described in, for example, a known literature: "Technology for Transparent Conductive Film" (Ohm-sha, Ltd., the 166th Committee on Photonic and Electronic Oxide Materials of the Japan Society for the Promotion of Science) and the like.

A method for doping or ion-implanting a glass material with metal ions and applying conductivity thereto by introduction of carriers will now be explained.

When conductivity is applied to the glass material itself by ion implantation or ion doping, one or plurality of metal elements such as Sn, In, P, As, B, Zn, Ti, Cu, Pb, and Ag or the like can be used as the metal ions.

Since it is known that the ion beam-based ion implantation varies in action at the surface of glass depending on acceleration energy and causes surface roughness in the case of low energy, it is necessary to use a suitable accelerating voltage. Normally, in the case of energy of a few tens of keV or more, ions are injected inside without applying a change to the surface. Since a distribution (injection depth) of the injected ions depends on the glass material and ion species, it is possible to control it by ion's acceleration energy.

A depth of 100 nm or so at energy of 100 keV serves as a guide for the relationship between the injection depth and energy. The dose amount of ions also has an appropriate value set according to the materials. When the dose amount is extremely large, this may cause irradiation damage. Coloring of the glass material, a change in refractive index, etc. are shown as examples therefor. Caution is required in ensuring translucency. For example, heat treatment is done after ion implantation to diffuse at a predetermined depth, ions implanted in glass, thereby forming a conductive layer, whereby conductivity can be applied without sacrificing transparency by the ion implantation. It is needless to say that these methods can be used to this end upon ion implantation in the glass material when the member for each transmissive portion 47 is fabricated.

Incidentally, it is known that ion implantation under different conditions and heat treatment is further useful for the coloring problem that arises where the ion implantation is performed at high dose. Since the coloring can be reduced by these methods, they can be applied upon formation of the transparent conductive glass material using the ion implantation.

Forming a metal element by a thermal diffusion method is also enabled as a method for introducing carriers into a surface layer portion of a glass material by doping. The thermal diffusion method makes use of the fact that the metal element moves from an area high in concentration to an area low in concentration by thermal diffusion to reach a metallic thermal equilibrium state. The known vapor phase diffusion and solid phase diffusion methods can be applied.

A method similar to a method for doping an Si wafer with an impurity can be used for the vapor phase diffusion method.

Firstly, a metallic gas is generated by vaporizing a metal element to be doped to suitable vapor pressure. For example, boron (B) is used as the metal element and a chloride gas (Cl2) being an inert gas is used for a carrier gas. Then, an oxygen gas (O2) is applied to undergo reaction and thereby cause the metallic gas and glass to reach with each other at a predetermined temperature, whereby the metal element can be thermally diffused into the glass to provide conductivity.

In the solid phase diffusion method, for example, a substrate target for diffusion containing a metal element to be doped is prepared. This is disposed opposite to glass and set to a diffusion furnace to be heated at a predetermined temperature, whereby a metal element is produced as a volatile gas from the substrate target for diffusion to react with the glass. Thus, the metal element is doped therein. A boron nitride plate is for general purpose use as the substrate target for diffusion. This method enables uniform doping and becomes the preferred means for applying conductivity to all-oriented surfaces of the glass.

As another solid phase diffusion method, for example, a polysilicon layer subjected to ion implantation is additionally formed on glass, which can also be used as a diffusion source. Since this is a manufacturing method for peeling off the polysilicon layer after diffusion processing and applying conductivity to the glass, the process increases the complexity. This method has, however, the merits that since it is possible to distribute ions to a shallow portion of a surface layer portion, reduction in resistance is easy to attain and that since only a polar surface layer portion is left modified, influences by ion implantation, such as a change in glass refractive index, coloring, surface roughness and the like become extremely small.

Similarly, as the solid phase diffusion method, it is also possible to diffuse metal ions doped into an SOG (spin-on-glass) film to thereby apply conductivity to glass. It is needless to say that in addition to the above, the application of conductivity to a glass material can be realized even by using known techniques such as a focused ion beam, a laser beam and the like, so that the transmissive portions 47 can be configured. When the conductivity is applied to the glass material itself by ion implantation or ion doping, the manufacturing process is more complex, but the possibility of the film peeling or possibility of particulate emission in the coating film is extremely low and thus very advantageous.

Incidentally, as the constituent member of each transmissive portion 47, fused silica glass, an ultra-low crystalline material, and composite glass can also be used in expansion glass material, calcium fluoride glass formed of a addition to the sapphire and synthetic quartz glass. Generally, crystalline glass has the feature that it is easy to apply conductivity by doping as compared with the amorphous material.

It is also possible to mix metal fine particles such as Ni, Cu, Cu—Ag and Ag or the like, and/or carbon or the like into a glass material as fillers to apply conductivity to the glass material itself. Since there is however a problem in that transmittance is degraded, it is necessary to ensure proper translucency while satisfying antistatic performance.

Further, it is also possible to use nitride, carbide and sulfide-based ceramics having translucency as the member or material for the transmissive portions 47. In that case, a material which is applied to the position detecting device of the electron beam writing apparatus according to the present embodiment and is capable of obtaining required light transmittance, is preferably selected and used with an appropriate thickness. The development of the AgI—Ag2O system is performed frequently as to ion conductive glass, and Li+ and Na+ ion conductive glass or the like are known. Although they are also low in transmittance, there is a possibility that they may be applied by thinning the materials.

Next, when light irradiation means for emitting ultraviolet light is used instead of the illumination device 11, and a light detecting unit for detecting the ultraviolet light is provided below the mask M, each of the transmissive portions 47 of the conductive portion 41 may preferably have transmissive performance appropriate to the ultraviolet light. In that case, the transmissive property of each transmission portion 47 with respect to the ultraviolet light may be such a level that the ultraviolet light having penetrated through the transmissive portion 47 reaches the lower light detecting unit and thereby the detection of the edge portion of the mask M is enabled.

Incidentally, when the LED for emitting light in an ultraviolet region or the light irradiation means such as other lamps, for radiating ultraviolet light is used, the wavelength of the radiated light may preferably be in such a wavelength region that the photosensitive polymer material or photosensitive resist lying on the mask is not exposed to light. The wavelength thereof is preferably 400 nm or more, for example.

When light irradiation means for radiating infrared light is used instead of the illumination device 11, and a light detecting unit for detecting the infrared light is provided below the mask M, each of the transmissive portions 47 of the conductive portion 41 may preferably have transmissive performance appropriate to the infrared light. In that case, the transmissive property of the transmissive portion 47 with respect to the infrared light may be such a level that the infrared light having penetrated through the transmissive portion 47 reaches the lower light detecting unit and thereby the detection of the edge portion of the mask M is enabled.

At this time, each of the transmissive portions 47 can be formed with a member having a selected characteristic being fitted in its corresponding cut-away portion provided at part of the conductive portion 41, but a gap might be formed at a portion joined to each of other parts of the conductive portion 41 in the case where the transmissive portion 47 is provided. When such a gap is formed, an electron beam might leak therefrom upon irradiation of the electron beam within the writing chamber 1 and reach the mask M, thus resulting in taking charge of the peripheral edge portion of the mask M. Thus, the transmissive portions 47 are preferably configured so as not to define the gap in such a junction.

Namely, it is possible to dispose a gap filling-in member in at least part of the portion joined to each of the other parts of the conductive portion 41. For example, a method is preferred which fills in the gap leading to the leakage of the electron beam by filling it with a member having a shape suitable for filling in at least partial gap of the formed gap or filling it with an adhesive material.

Figure 5:
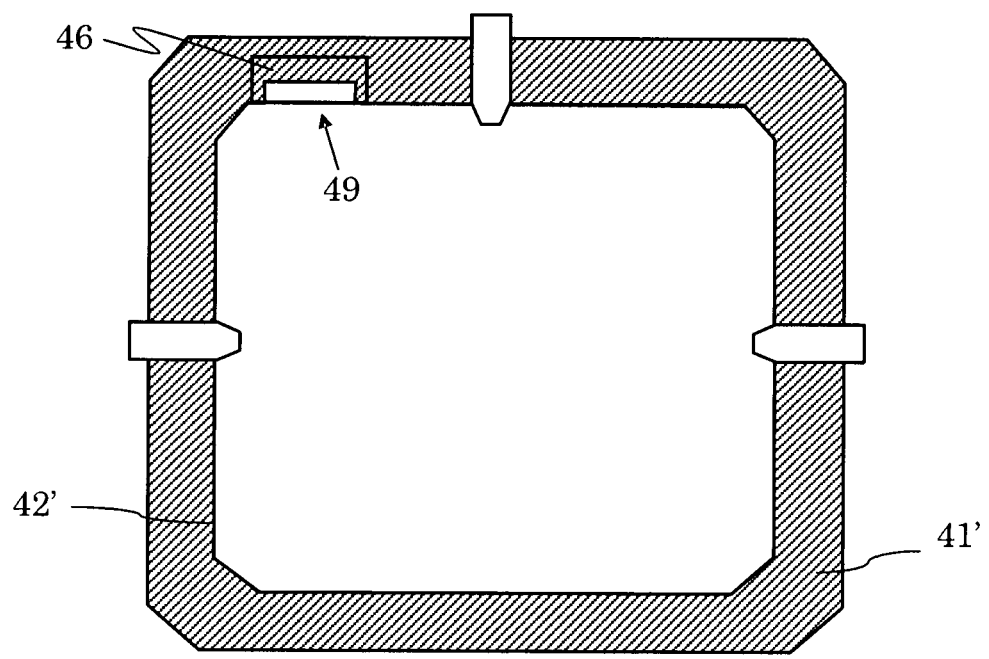
FIG. 5 is a top view showing another example of the substrate cover according to the present embodiment.

FIG. 5 is a top view showing another example of the substrate cover according to the present embodiment. As shown in FIG. 5, a method is also preferred for forming a plate-like member 46 that has an area larger than that of a cut-away portion 49 of a conductive portion 41' and enables desired light to pass through and covering the entire cut-away portion 49 from above using the plate-like member 46. In this case, the plate-like member 46 is capable of making up a conductive portion from a member formed by providing a transparent conductive film such as ITO at the surface of ion conductive glass, synthetic quartz or sapphire having transmissive performance relative to the desired light.

Figure 6:
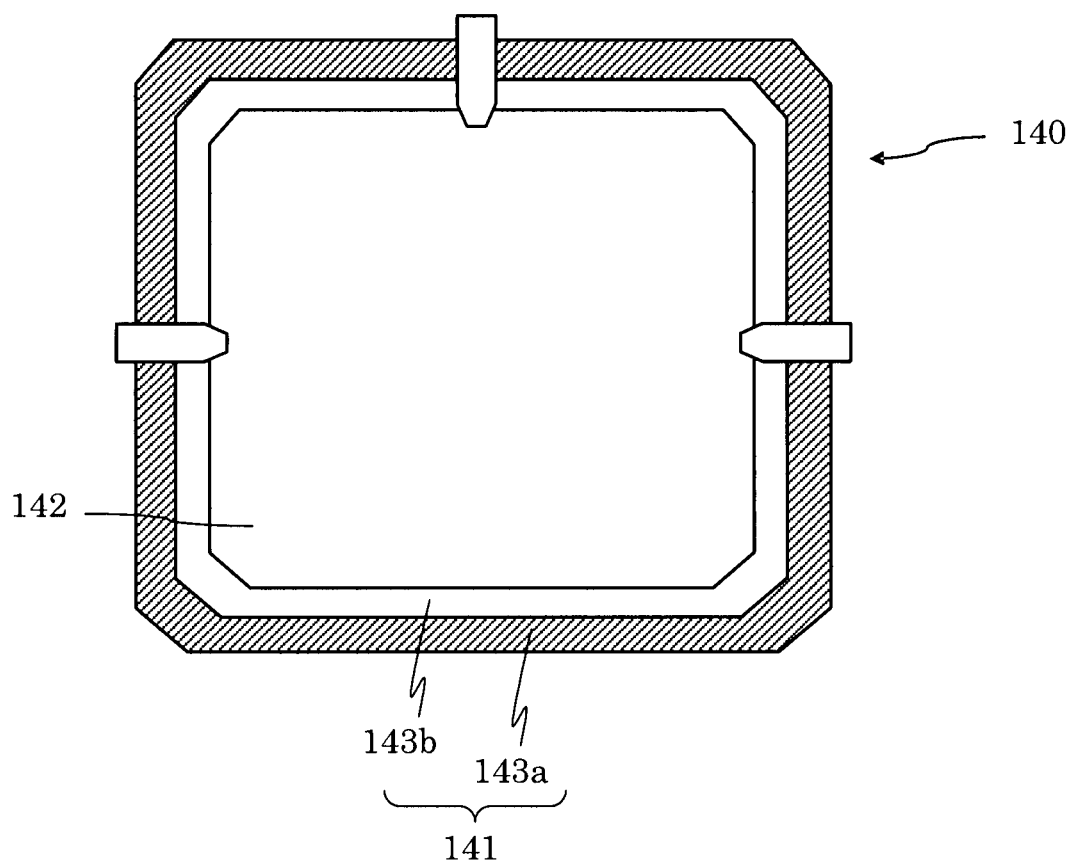
FIG. 6 is a top view showing a further example of the substrate cover according to the present embodiment.

Incidentally, as shown in FIG. 6, a frame-like conductive portion 141 included in a substrate cover 140 is preferably configured as a double structure formed of members different in property. FIG. 6 is a top view showing a further example of the substrate cover according to the present embodiment.

As shown in FIG. 6, it is also possible to select a member formed by providing a member constituting an outer portion 143a of the substrate cover 140 having the double structure with conductivity, heat resistance and a mechanical strength, provide a member constituting an inner portion 143b surrounding an opening 142 with conductivity and heat resistance, select a member which enables light having a desired property to pass through, and thereby configure the entire conductive portion 141. When the conductive portion 141 is configured in this way, the gap existing in the above junction is not defined in the portion irradiated with the electron beam within the writing chamber 1. In this case, the inner portion 143b is capable of making up a conductive portion from a member formed by providing a transparent conductive film such as ITO at the surface of ion conductive glass, synthetic quartz or sapphire having transmissive performance relative to the desired light.

Further, the entire conductive portion with conductivity having a shape corresponding to a peripheral edge region of a mask constituting a substrate cover can also be formed of a member having light transmissive performance relative to desired light without providing such cut-away portions as shown in FIG. 3 at the conductive portion. In that case, it is possible to make up the conductive portion from a member formed by providing a transparent conductive film such as ITO at the surface of ion conductive glass, synthetic quartz or sapphire having transmissive performance relative to desired light. It is preferable to select a member constituting the conductive portion in consideration of a mechanical strength, its manufacturing cost and the like.

As shown in FIG. 4, the conductive portion 41 has electrode portions 45a, 45b, and 45c each provided with a needle-shaped electrode 43 at one end thereof and a support portion 44 whose section has an arch shape at the other end thereof. Each support portion 44 has the function of supporting the substrate cover 40 within the storage chamber 9. A location to provide the cone-shaped substrate cover 40 is provided on the side of the storage chamber 9 so as to correspond to the shape of each support portion 44, and the support portion 44 is configured so as to be arch-shaped in section. Thus, when the substrate cover 40 is carried out of the writing chamber 1 and retuned to the storage chamber 9, the substrate cover 40 can automatically be returned to its normal position even though it is shifted in the front-to-back and side-to-side directions.

Since the electrode portions 45a, 45b, and 45c respectively have the function of supporting the substrate cover 40, it is preferable to dispose them at three locations in such a manner that the load of the conductive portion 41 becomes an approximately equal distribution. It is thus possible to prevent the substrate cover 40 from being shifted when the stage St is moved within the writing chamber 1. It is possible to support the conductive portion 41 horizontally. Incidentally, when the electrode portions 45a, 45b, and 45c are disposed in four or more locations, this is undesirable because locations brought into no contact with the mask M are formed.

Any of the electrode portions 45a, 45b, and 45c is attached to the conductive portion 41 in such a manner that the needle-shaped electrodes 43 are exposed from the opening 42 of the conductive portion 41 and the spherical support portions 44 are exposed to the outside of the conductive portion 41.

Figure 7:
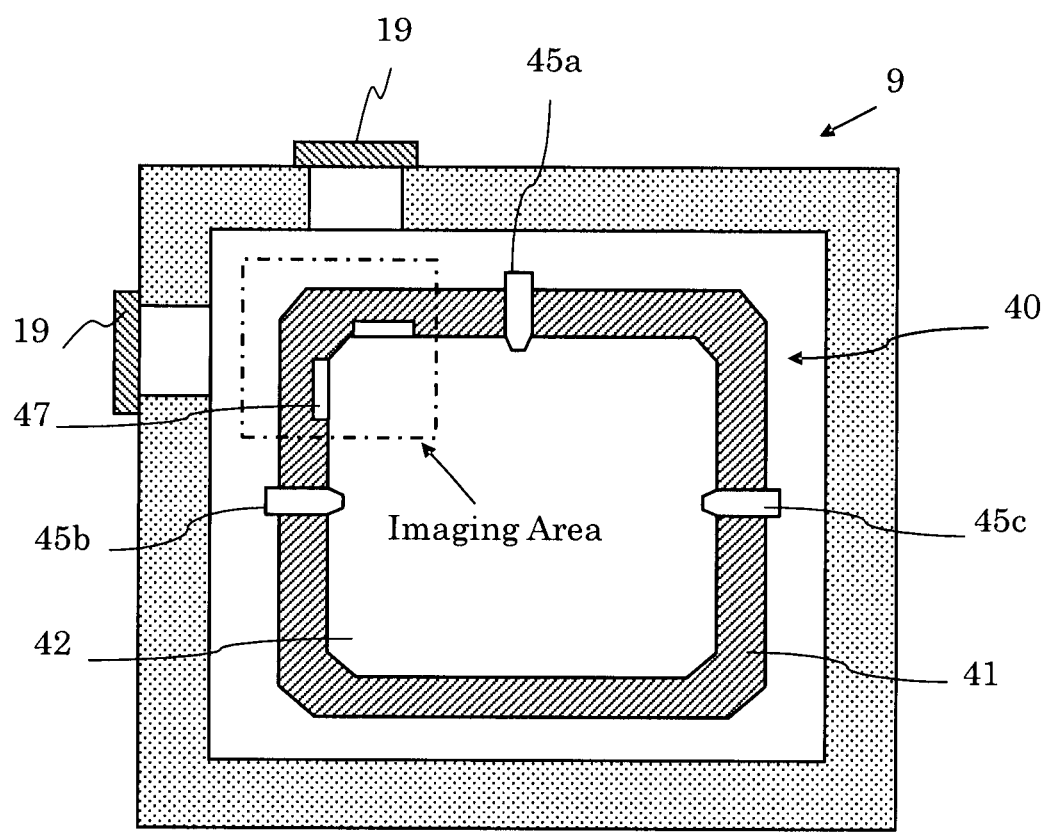
FIG. 7 is a schematic plan view showing the inside of the storage chamber.
Figure 8:
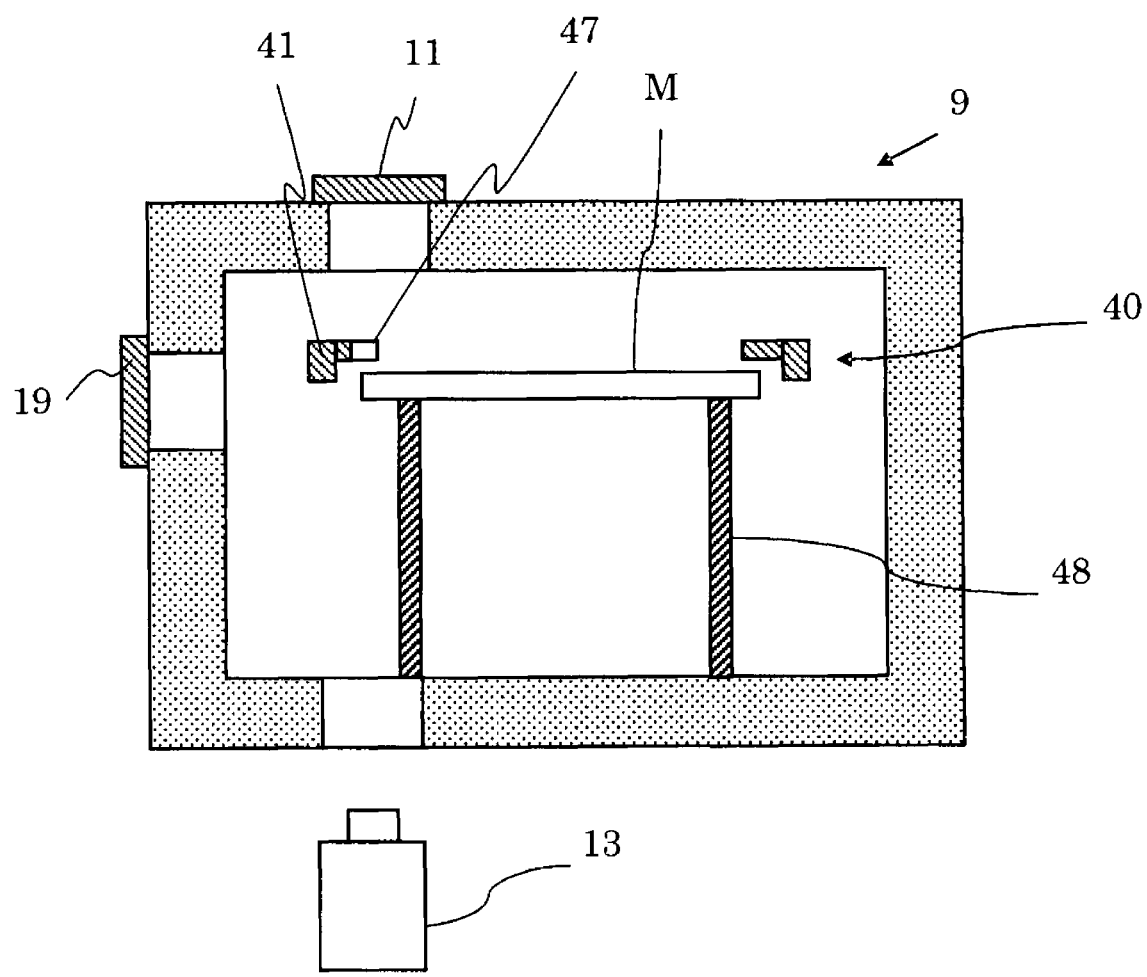
FIG. 8 is a schematic cross-sectional view of the storage chamber.

FIG. 7 is a schematic plan view showing the positioning between the light irradiation means, substrate cover, and mask within the storage chamber included in the electron beam writing apparatus according to the present embodiment. FIG. 8 is a schematic cross-sectional view showing the positioning between the light irradiation means, CCD camera corresponding to the light detecting unit, substrate cover, and mask within the storage chamber included in the electron beam writing apparatus according to the present embodiment.

As shown in FIGS. 7 and 8, the substrate cover 40 is accommodated in the storage chamber 9. Here, the substrate cover 40 can be placed on the mask M conveyed to within the storage chamber 9 and supported on posts 48, and mounted thereon or demounted therefrom.

The position detecting device 10 is provided within the storage chamber 9 of the present embodiment, and the alignment of the mask M is enabled. The position detecting device 10 has an illumination device 11 and two side illumination devices 19 as light illumination means. The two side illumination devices 19 are provided in such a manner that the selection of each side surface to be irradiated with light is made possible corresponding to an improvement in the accuracy of position detection and the shape of each mask's side surface. Namely, the two side illumination devices 19 which enable light irradiation from two different directions are provided such that the detection of edge positions at the different side surfaces of the mask M is enabled.

The detection of the edge position of the mask M by the illumination device 11, the detection of the edge positions of the mask M by the side illumination devices 19, and the detection of each edge position of the mask M by the combination of the illumination device 11 and the side illumination devices 19 are enabled. The alignment of the mask M is enabled before the placement of the substrate cover 40. Likewise, the illumination to the mask M from above the mask M by the illumination device 11 is enabled even after the placement of the substrate cover 40 on the mask M. It is thus possible to perform the detection of each edge position of the mask M and the alignment of the mask M with high accuracy. The detection of each edge position of the mask M by the optimum method is suitably enabled in consideration of the presence or absence of the placement of the substrate cover 40, the state of each side surface portion of the mask M, and the like. As a result, the alignment of the mask M is made possible.

In a manner similar to the detection of each edge position of the mask M, the position of the substrate cover 40 placed on the mask M can be detected using the position detecting device 10, and the positioning between the mask M and the substrate cover can also be controlled.

A description will next be made in more detail of writing to the mask M by an electron beam, which is performed in the writing chamber 1 of the electron beam writing apparatus 100 according to the present embodiment.

Figure 9:
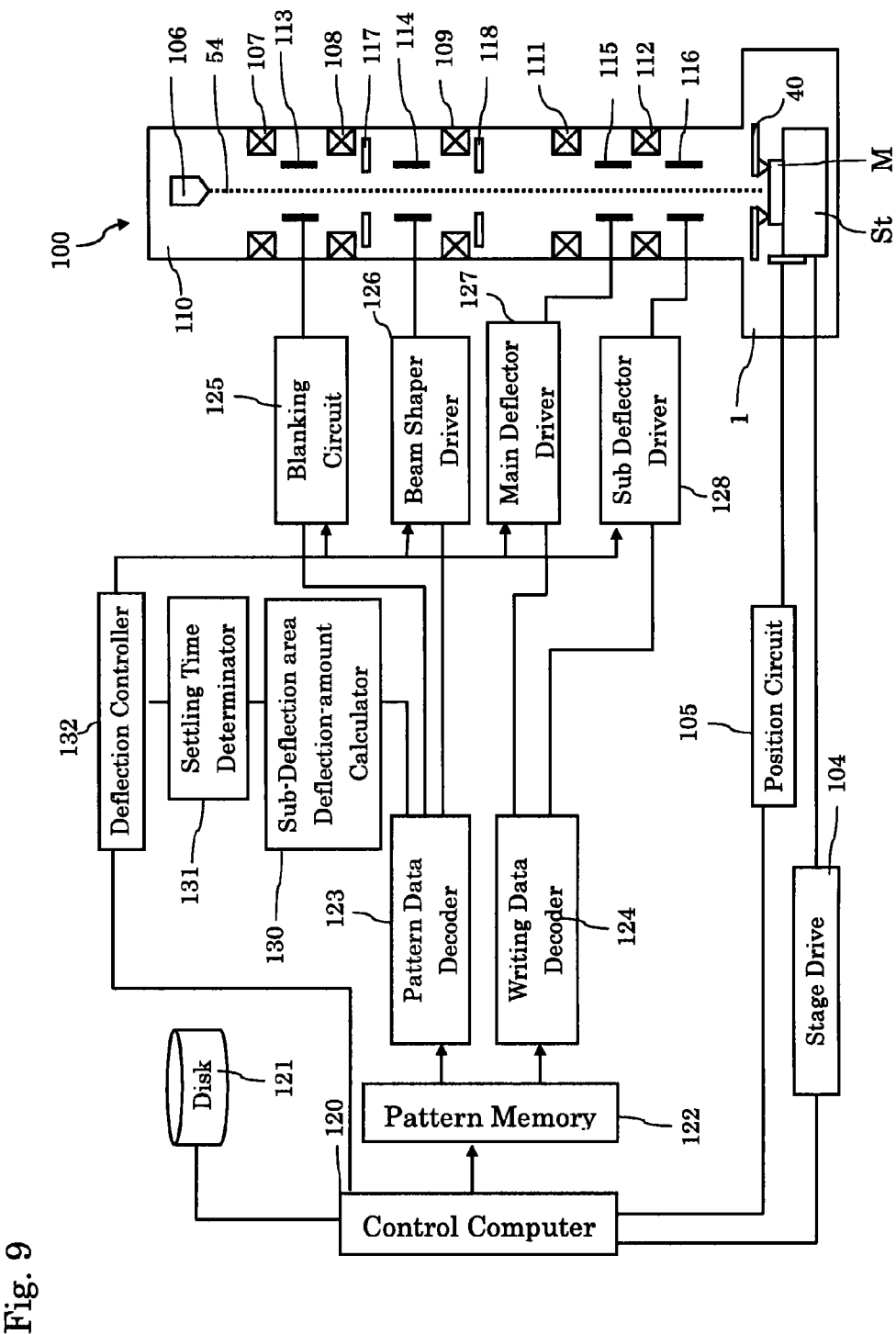
FIG. 9 is a schematic diagram showing the electron beam writing apparatus according to the present embodiment.

FIG. 9 is a schematic diagram showing the electron beam writing apparatus according to the present embodiment.

In FIG. 9, a stage St on which the mask M is placed as a substrate target to be written by the electron beam is provided within the writing chamber 1 of the electron beam writing apparatus 100. A substrate cover 40 corresponding to the embodiment of the present invention is placed on the mask M. The stage St is driven by a stage drive circuit 104. The position of movement of the stage St is measured by a position circuit 105 using a laser length measuring instrument or the like.

An electron beam optical system 110 is disposed above the writing chamber 1. The electron beam optical system 110 comprises an electron gun 106, various lenses 107, 108, 109, 111, and 112, a blanking deflector 113, a shaping deflector 114, a main deflector 115 for beam scanning, a sub-deflector 116 for beam scanning, and two beam forming apertures 117 and 118, etc.

Figure 10:
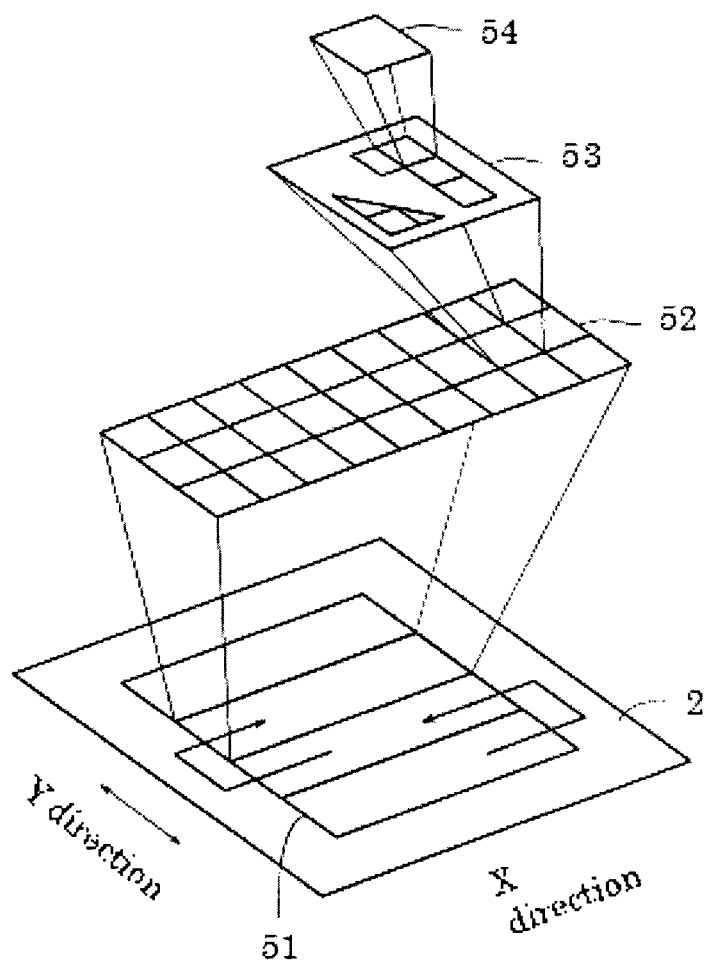
FIG. 10 is a diagram for explaining an electron beam writing method.
Figure 11:
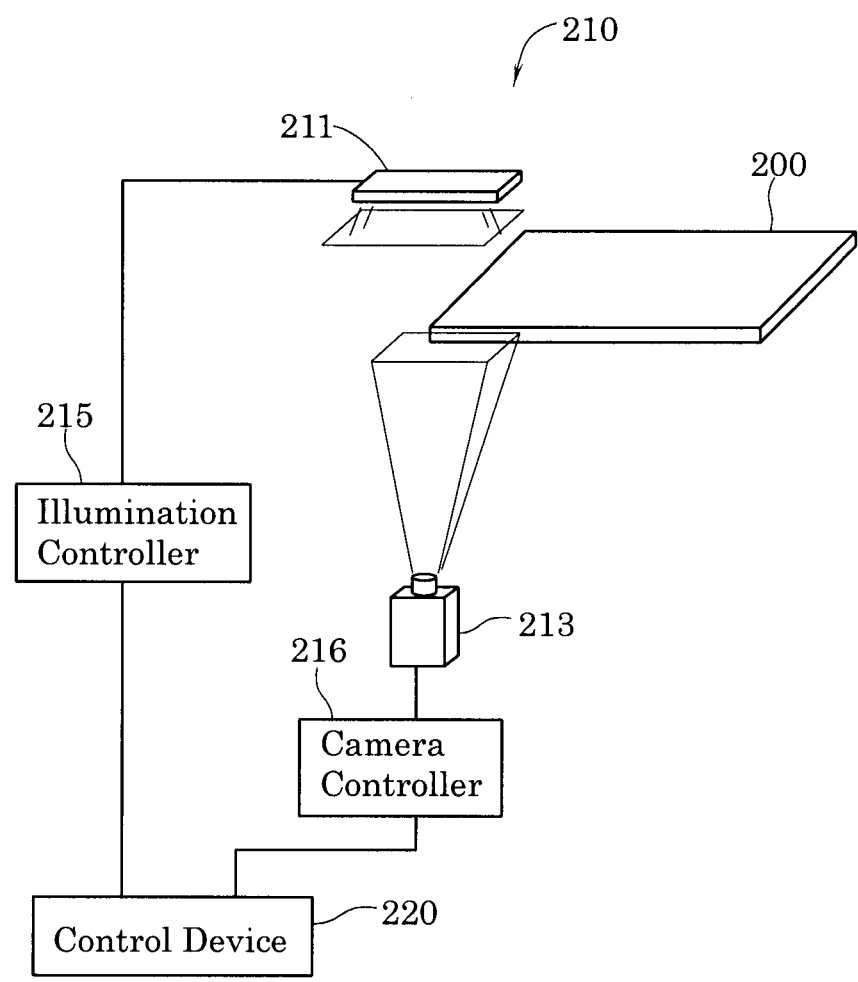
FIG. 11 is a schematic diagram showing a configuration of a position detecting device applicable to a conventional electron beam writing apparatus.

FIG. 10 is a diagram for explaining an electron beam writing method. As shown in the drawing, a pattern 51 to be written on a mask M is divided into strip-shaped frame areas 52. Writing by an electron beam 54 is performed for each frame area 52 while the stage St is being moved continuously in one direction (e.g., X direction). The frame area 52 is further divided into sub deflection areas 53. The electron beam 54 performs writing to only a required portion lying in each sub deflection area 53. Incidentally, the frame area 52 is of a strip-shaped writing area determined according to the deflection width of the main deflector 115, whereas the sub deflection area 53 is of a unit writing area determined according to the deflection width of the sub-deflector 116.

The positioning of the electron beam 54 in the sub deflection area 53 is performed by the main deflector 115, and the writing in the sub deflection area 53 is controlled by the sub-deflector 116. Namely, the electron beam 54 is positioned to the predetermined sub deflection area 53 by the main deflector 115, and the position to be written in the sub deflection area 53 is determined by the sub-deflector 116. Further, the shape and size of the electron beam 54 are determined by the shaping deflector 114 and the beam forming apertures 117 and 118. Writing is performed within the sub deflection area 53 while the stage St is being moved continuously in one direction. After the completion of the writing to one sub deflection area 53, the next sub deflection area 53 is written. After the completion of writing to all the sub deflection areas 53 in the frame area 52, the stage St is step-moved in the direction (e.g., Y-direction) orthogonal to the direction in which the stage St is moved continuously. Thereafter, similar processing is repeated to perform writing on the frame areas 52 sequentially.

In FIG. 9, writing data for the mask M has been stored in a magnetic disk 121 corresponding to a storage medium. The writing data read from the magnetic disk 121 is temporarily stored in a pattern memory 122 for each frame area 52. Pattern data for each frame area 52 stored in the pattern memory 122, or frame information made up of writing positions and writing graphics data or the like is sent to a pattern data decoder 123 and a writing data decoder 124 corresponding to a data analyzing unit.

The information from the pattern data decoder 123 is sent to a blanking circuit 125 and a beam shaper driver 126. Specifically, blanking data based on the above data is created by the pattern data decoder 123 and sent to the blanking circuit 125. Desired beam size data is also created and sent to the beam shaper driver 126. Then, the beam shaper driver 126 applies a predetermined deflection signal to the shaping deflector 114 of the electron beam optical system 110, whereby the size of the electron beam 54 is controlled.

A deflection controller 132 is connected to a control computer 120. The deflection controller 132 is connected to a settling time determinator 131. The settling time determinator 131 is connected to a sub-deflection area deflection-amount calculator 130. The sub-deflection area deflection-amount calculator 130 is connected to the pattern data decoder 123. The deflection controller 132 is connected to the blanking circuit 125, the beam shaper driver 126, a main deflector driver 127, and a sub-deflector driver 128.

An output of the writing data decoder 124 is sent to the main deflector driver 127 and the sub-deflector driver 128. Then, a predetermined deflection signal is applied from the main deflector driver 127 to the main deflector 115 of the electron beam optical system 110 so that the electron beam 54 is deflected and scanned to a predetermined main deflection position. Further, a predetermined sub deflection signal is applied from the sub-deflector driver 128 to the sub-deflector 116 so that writing is conducted within the sub deflection area 53.

Writing control by the control computer 120 will next be explained.

The control computer 120 reads out writing data about a mask substrate recorded in the magnetic disk 121 corresponding to the storage medium. The read writing data is temporarily stored in the pattern memory 122 for each frame area 52.

The writing data for each frame area 52 stored in the pattern memory 122, i.e., frame information made up of writing positions and writing graphics data or the like is sent to the sub-deflection area deflection-amount calculator 130, blanking circuit 125, beam shaper driver 126, main deflector driver 127, and sub-deflector driver 128 through the pattern data decoder 123 and the writing data decoder 124 corresponding to the data analyzing unit.

The pattern data decoder 123 creates blanking data based on the writing data and sends it to the blanking circuit 125. Further, the pattern data decoder 123 creates desired beam shape data based on the writing data and sends it to the sub-deflection area deflection-amount calculator 130 and the beam shaper driver 126.

The sub-deflection area deflection-amount calculator 130 calculates an amount of deflection (moving distance) of an electron beam for each shot in the sub deflection area 53 from the beam shape data created by the pattern data decoder 123. The calculated information is sent to the settling time determinator 131, where the settling time corresponding to the moving distance based on sub deflection is determined.

After the settling time determined at the settling time determinator 131 has been sent to the deflection controller 132, the deflection controller 132 suitably sends it to any of the blanking circuit 125, beam shaper driver 126, main deflector driver 127, and sub-deflector driver 128 while measuring timing for pattern's writing.

The beam shaper driver 126 applies a predetermined deflection signal to the shaping deflector 114 of the electron beam optical system 110 to control the shape and size of the electron beam 54.

The writing data decoder 124 creates positioning data of the sub deflection area 53 based on the writing data and sends it to the main deflector driver 127. Then, the main deflector driver 127 applies a predetermined deflection signal to the main deflector 115, so that the electron beam 54 is deflected and scanned to a predetermined position of the sub deflection area 53.

The writing data decoder 124 generates a control signal for scanning of the sub-deflector 116 based on the writing data. After the control signal has been sent to the sub-deflector driver 128, the sub-deflector driver 128 applies a predetermined sub deflection signal to the sub-deflector 116. After the set settling time has elapsed, the writing in the sub deflection area 53 is conducted by radiating the electron beam 54 repeatedly.

A method for writing by electron beam irradiation performed within the writing chamber of the electron beam writing apparatus will now be explained in more detail.

First, the substrate cover 40 is placed on the mask M within the storage chamber 9 provided outside the writing chamber 1, and the mask M with the substrate cover 40 placed thereon is carried into the writing chamber 1.

In the present embodiment, however, the substrate cover 40 is fixed onto the stage St without prior positioning inside the storage chamber 9. After the mask M has been carried into the writing chamber 1, the substrate cover 40 may be placed on the mask M within the writing chamber 1.

Then, the mask M is placed on the stage St. At this time, the mask M with the substrate cover 40 placed thereon is grounded by the electrodes 43 of the substrate cover 40. Its grounding enables prevention of both charging of a resist at writing and charging at the peripheral edge portion of the mask M and allows an electric charge to escape to the earth. Then, the detection of position of the stage St is performed by the position circuit 105, and the stage St is moved to a writable position by the stage drive circuit 104 based on a signal from the control computer 120.

Next, the electron beam 54 is emitted from the electron gun 106. The emitted electron beam 54 is focused by the illumination lens 107. Then, the blanking deflector 113 performs an operation as to whether the electron beam 54 should be applied onto the mask M.

The electron beam 54 radiates to the first aperture 117, passes through an opening of the first aperture 117 and is thereafter deflected by the shaping deflector 114 controlled by the beam shaper driver 126. Then, the electron beam 54 assumes a desired shape and size by passing through an opening defined in the second aperture 118.

After the electron beam 54 has been shaped to the required dimensions, it is reduced by the reduction lens 111. Then, the position to radiate the electron beam 54 on the mask M is controlled by the main deflector 115 controlled by the main deflector driver 127 and the sub-deflector 116 controlled by the sub-deflector driver 128. The main deflector 115 directs the electron beam 54 to the sub deflection area 53 on the mask M. The sub-deflector 116 positions a writing position within the sub deflection area 53.

Writing to the mask M by the electron beam 54 is performed by irradiating the electron beam 54 while moving the stage St in one direction. Specifically, the writing of patterns in each sub deflection area 53 is performed while the stage St is being moved in one direction. After the completion of writing for all the sub deflection areas 53 lying in one frame area 52, the stage St is moved to a new frame area 52, where writing is conducted in the same manner.

After the writing for all frame areas 52 of the mask M has been completed in the above-described manner, the mask M is carried out of the writing chamber 1 in a state in which the substrate cover 40 has been placed on the mask M. Then, the substrate cover 40 which was placed on the mask M within the storage chamber 9 is removed from the mask M. Incidentally, in a situation when the substrate cover 40 is fixed onto the stage St, after the writing for all frame areas 52 of the mask M has been completed, the substrate cover 40 is then raised off of the mask M within the writing chamber 1, the mask M is thereafter carried out from the writing chamber 1.

The features and advantages of the present invention may be summarized as follows: According to the present invention, the position of an edge portion of a substrate is detected using a position detecting device including a light irradiation means and a light detecting unit while a substrate cover remains placed on the substrate. In particular, the light irradiation means can be provided above the substrate. Light emitted from the light irradiation means provided above the substrate penetrates through part of the substrate cover placed on the substrate and thereby enables the application of light to the substrate's edge upon which the substrate cover has been placed.

As a result, it is possible to determine the substrate's edge using the above position detecting device without the influence of the shape of the edge portion of the substrate.

The same position detecting device which determines the edge of a substrate enables the positioning of a substrate cover and makes it possible to control the positioning between the substrate and the substrate cover accurately.

It is thus possible to position the substrate target for writing with desired accuracy, control the positioning between the substrate and the substrate cover with desired accuracy, and realize charged particle beam writing in a desired pattern size and with desired pattern accuracy.

Although, for example, the above embodiment has shown the example in which the conductive portion 41 of the substrate cover 40 is provided with the two transmissive portions 47 as shown in FIG. 3, it is possible to suitably increase or decrease the number of the transmissive portions 47 to be provided corresponding to the locations where the edge positions of the mask M are detected, and change their installation or placement to alternative corresponding positions.

If deteriorations and degeneration such as the photosensitive polymeric material and the photosensitive resist lying on the mask M being exposed to light do not occur in the substrate cover of the present embodiment, the substrate cover can be applied even to a position detecting device in which light other than visible light is used for mask's position detection.

Further, in the present embodiment, the substrate cover can be placed on the mask within the storage chamber or the writing chamber. Therefore, the present embodiment can be applied even to an electron beam writing apparatus without the storage chamber.

Although an electron beam has been used in the above embodiment, the present invention is not limited to this. It is applicable when other charged particle beams such as an ion beam and the like are used.

The invention claimed is:

1. A substrate cover positioned on a substrate wherein a charged particle beam will write a pattern on the substrate, the substrate cover comprising:
   a conductive portion being larger in outer dimension than an outer peripheral end of the substrate, which has an opening in a center thereof in a size smaller than the outer peripheral end of the substrate, and
   a translucent portion provided in at least part of an inner peripheral edge portion around the opening of the conductive portion,
   wherein a gap leading to leakage of the charged particle beam thereof between the translucent portion and a portion other than the translucent portion is filled with a member designed for filling in the gap, and
   wherein the translucent portion is configured to have light penetrate therethrough and the light irradiates an edge of the substrate for detecting an edge position of the substrate.

2. The substrate cover according to claim 1, wherein the conductive portion comprises a conductive material or a film of a conductive material provided on the surface of an insulative material.

3. The substrate cover according to claim 1, wherein the conductive portion comprises:
   the conductive portion formed of a conductive material including a rectangular parallelepiped cut-away portion in part of the inner peripheral edge portion around the opening; and
   a member combining conductivity and translucency and fitted in the cut-away portion as the translucent portion.

4. The substrate cover according to claim 1, wherein the conductive portion comprises:

the conductive portion formed of a conductive material including a rectangular parallelepiped cut-away portion in part of the inner peripheral edge portion around the opening; and a plate-like member having an area larger than the cut-away portion from above, and combining conductivity and translucency as the translucent portion.

5. A charged particle beam writing method comprising:

placing a substrate cover on a substrate which is a target for writing using a charged particle beam;

wherein the substrate cover includes a conductive portion, which is larger in outer dimension than an outer peripheral end of the substrate, which has an opening in a center thereof in a size smaller than the outer peripheral end of the substrate, and a translucent portion provided in at least part of an inner peripheral edge portion around the opening of the conductive portion, wherein the translucent portion is configured to have light penetrate therethrough and the light irradiates an edge of the substrate for detecting an edge position of the substrate;

wherein a gap leading to leakage of the charged particle beam thereof between the translucent portion and a portion other than the translucent portion is filled with a member designed for filling in the gap; and disposing the substrate with the substrate cover placed thereon between a light irradiation means and a light detecting unit for detecting light emitted from the light irradiation means;

aligning the substrate by detecting the light emitted from the light irradiation means and penetrating the translucent portion of the conductive portion using the light detecting unit to detect a position of the edge position of the substrate; and writing by irradiating the substrate with the charged particle beam.

6. The charged particle beam writing method according to claim 5, wherein the placing the substrate cover on the substrate is performed outside a writing chamber in which the charged particle beam is applied to the substrate.

* * * * *